US008652255B2

(12) United States Patent
Stahlbush et al.

(10) Patent No.: US 8,652,255 B2
(45) Date of Patent: Feb. 18, 2014

(54) METHOD OF PRODUCING EPITAXIAL LAYERS WITH LOW BASAL PLANE DISLOCATION CONCENTRATIONS

(75) Inventors: Robert E Stahlbush, Silver Spring, MD (US); Brenda L VanMil, Alexandria, VA (US); Kok-Keong Lew, Hillsboro, OR (US); Rachael L Myers-Ward, Alexandria, VA (US); David Kurt Gaskill, Alexandria, VA (US); Charles R. Eddy, Jr., Columbia, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 686 days.

(21) Appl. No.: 12/248,126

(22) Filed: Oct. 9, 2008

(65) Prior Publication Data

US 2009/0114148 A1    May 7, 2009

Related U.S. Application Data

(60) Provisional application No. 60/979,443, filed on Oct. 12, 2007.

(51) Int. Cl.
*C30B 25/14*    (2006.01)

(52) U.S. Cl.
USPC ............... 117/97; 117/84; 117/88; 117/89; 117/93; 117/94; 117/102; 117/105; 117/106; 117/951

(58) Field of Classification Search
USPC ............ 117/89, 84, 88, 93, 94, 97, 102, 105, 117/106, 951
See application file for complete search history.

(56) References Cited

U.S. PATENT DOCUMENTS

| 7,018,554 | B2 | 3/2006 | Sumakeris |  |
|---|---|---|---|---|
| 7,226,805 | B2 | 6/2007 | Hallin et al. |  |
| 7,230,274 | B2 | 6/2007 | O'Loughlin et al. |  |
| 7,279,115 | B1 | 10/2007 | Sumakeris |  |
| 2001/0046757 | A1* | 11/2001 | Takahashi et al. | 438/518 |
| 2005/0181627 | A1* | 8/2005 | Kamata et al. | 438/778 |
| 2006/0011128 | A1 | 1/2006 | Ellison et al. |  |
| 2006/0267021 | A1* | 11/2006 | Rowland et al. | 257/77 |
| 2007/0015333 | A1* | 1/2007 | Kishimoto et al. | 438/259 |
| 2007/0090370 | A1 | 4/2007 | Nakayama et al. |  |
| 2007/0108450 | A1* | 5/2007 | O'Loughlin et al. | 257/77 |
| 2007/0290211 | A1* | 12/2007 | Nakayama et al. | 257/77 |

OTHER PUBLICATIONS

Skowronski et al., "Degradation of hexagonal silicon-carbide-based bipolar devices" J. Appl. Phys., 99, 011101 (2006).

(Continued)

*Primary Examiner* — Matthew Song
(74) *Attorney, Agent, or Firm* — US Naval Research Laboratory; Joseph T. Grunkemeyer

(57) ABSTRACT

A method of: flowing a silicon source gas, a carbon source gas, and a carrier gas into a growth chamber under growth conditions to epitaxial grow silicon carbide on a wafer in the growth chamber; stopping or reducing the flow of the silicon source gas to interrupt the silicon carbide growth and maintaining the flow of the carrier gas while maintaining an elevated temperature in the growth chamber for a period of time; and resuming the flow of the silicon source gas to reinitiate silicon carbide growth. The wafer remains in the growth chamber throughout the method.

17 Claims, 2 Drawing Sheets

(56) References Cited

OTHER PUBLICATIONS

Stahlbush et al., "Evolution of Basal Plane Dislocations During 4H-SiC Epitaxial Growth" Materials Science Forum, 600-603, 317-320 (online Sep. 26, 2008).

Pakula et al., "Reduction of dislocation density in heteroepitaxial GaN: role of SiH4 treatment" J. Crystal Growth, 267, 1-7 (2004).

Vanmil et al., "Basal Plane Dislocation Reduction for 8o off-cut, 4H-SiC Using in situ Growth Intereuptions" Presentation to MRS Spring Meeting, D5.4 (Mar. 26, 2008).

Vanmil et al., "Basal plane dislocation reduction for 8° off-cut, 4H-SiC using in situ variable temperature growth interruptions" J. Vac. Sci. Technol. B, 26, 1504-1507 (2008).

Zhang et al., "Mechanism of eliminating basal plane dislocations in SiC thin films by epitaxy on an etched substrate" Appl. Phys. Lett., 89, 081910 (2006).

PCT Search Report and Written Opinion.

* cited by examiner

METHOD OF PRODUCING EPITAXIAL LAYERS WITH LOW BASAL PLANE DISLOCATION CONCENTRATIONS

This application claims the benefit of U.S. Provisional Patent Application No. 60/979,443, filed on Oct. 12, 2007. The provisional application and all other publications and patent documents referenced throughout this nonprovisional application are incorporated herein by reference.

TECHNICAL FIELD

The disclosed method is generally related to epitaxial growth processes.

DESCRIPTION OF RELATED ART

Since the ABB (Asea Brown Boveri) power company disclosed the forward voltage, $V_f$, drift problem that degraded their PiN diodes, it has been well established that the $V_f$-drift problem is due to expanding Shockley stacking faults that originate from basal plane dislocations (BPDs) and that the only way to overcome this problem is to reduce the BPD density in the epitaxial layer that forms the active region of SiC power devices. The major source of BPDs in the epitaxy is from BPDs in the wafer. At the start of epitaxial growth, 70-90% of the substrate BPDs are converted to threading edge dislocations (TEDs) and the resulting BPD density in the epitaxy is typically in the 100-1000 cm$^{-2}$ range; a further reduction by at least a 2-3 orders of magnitude is required for device production. For devices requiring higher reverse blocking voltages, the problem of BPDs becomes exacerbated since these devices require larger areas and hence further reduction of BPDs is essential.

Several techniques have been developed to decrease BPD density in the epitaxy. Two of the techniques alter the wafer surface before epitaxial growth. The first is a surface patterning process that was originally developed and patented by ABB and later used by Cree. The optical pattern it produces often introduces problems doing lithography for device fabrication. The second is a process that involves KOH etching, epitaxial growth, and repolishing. It was developed by Cree. Cree has tested both processes and found the KOH etching one to be more effective (Sumakeris et al., *Mater. Sci. Forum*, 527-529, 141-146 (2006)). This creates pits at each of the dislocations including the BPDs, and this technique also increases the BPD-to-TED conversion at the beginning of the growth. However, the top of the growth surface remains pitted. An initial layer is grown and the wafer is polished to restore a smooth surface. It should be noted that this latter technique involves handling and wafers polishing which significantly adds to the overall cost of the final product. Another technique is to grow the epitaxial layers on wafers with an offcut angle lower than the standard 8° angle used for 4H—SiC (Chen et al., *J. Appl. Phys.*, 98, 114907 (2005)). As with the previous techniques, it increases the BPD-to-TED conversion at the beginning of the growth. The tradeoff is that lowering the offcut angle tends to introduce other extended defects that degrade device performance and step bunching is more difficult to control.

BRIEF SUMMARY

Disclosed herein is a method comprising: flowing a silicon source gas, a carbon source gas, and a carrier gas into a growth chamber under growth conditions to epitaxial grow silicon carbide on a wafer in the growth chamber; stopping or reducing the flow of the silicon source gas to interrupt the silicon carbide growth and maintaining the flow of the carrier gas while maintaining an elevated temperature in the growth chamber for a period of time; and resuming the flow of the silicon source gas to reinitiate silicon carbide growth. The wafer remains in the growth chamber throughout the method.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

Figure 1:
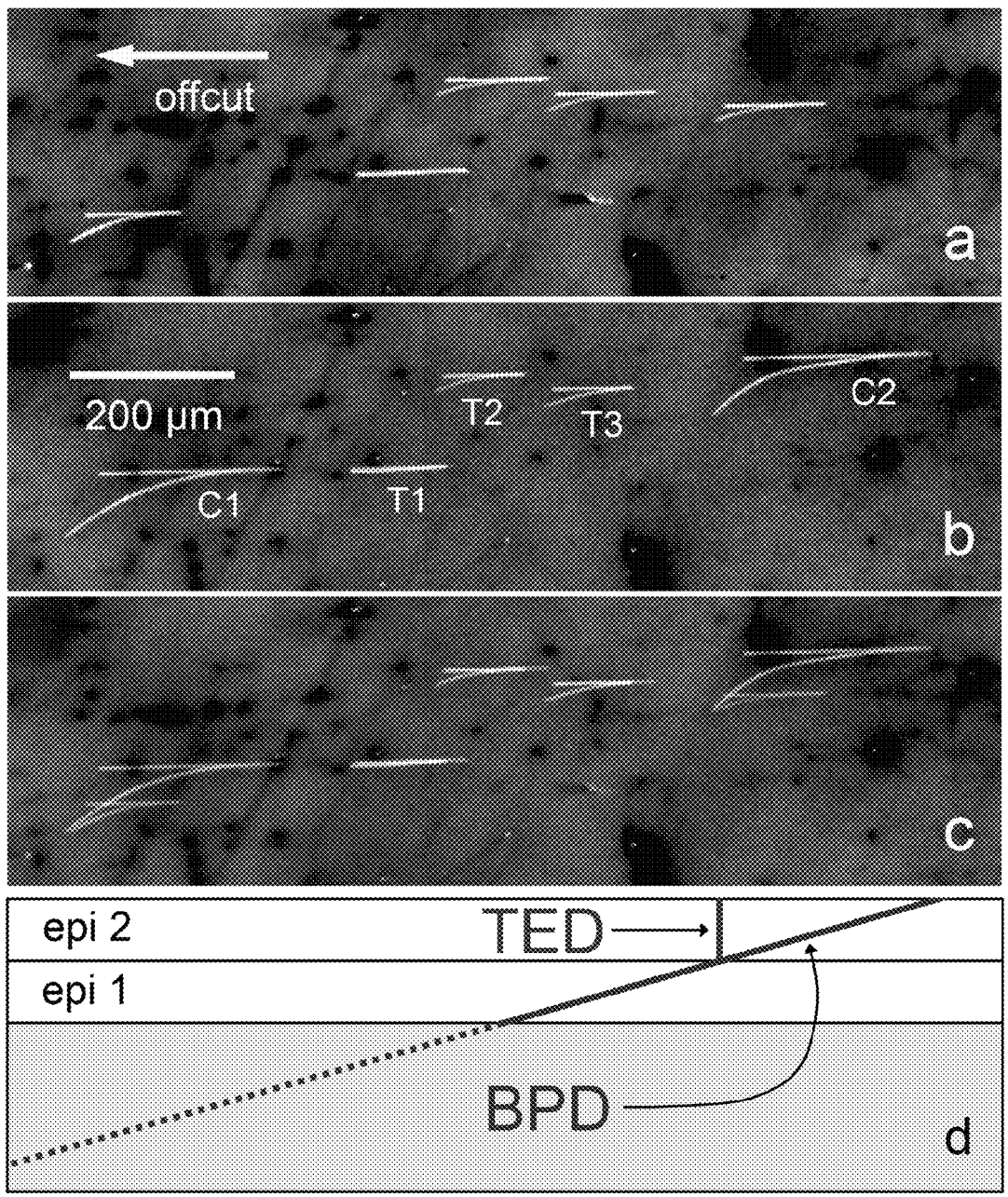
FIG. 1 shows UVPL images (a-c) of BPDs and (d) a schematic cross-sectional view: (a) after the initial 20 µm growth, (b) after an ex situ interrupt and subsequent 20 µm growth, sample 427 in Table 4, and (c) an overlay of (a) and (b). T and C are the labels for converted (turned) and continuing BPDs, respectively.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed is a process for lowering the BPD density in the epitaxy. It relies on epitaxial growth interrupts, which produce BPD-to-TED conversions in addition to those at the substrate/epi interface. BPD reductions by ex situ and in situ interrupts have been investigated. The paths of BPDs traversing the epitaxial layer have been tracked with UVPL imaging to observe the BPD conversion. The emphasis has been on in situ interrupts because they are easy to incorporate into the growth process. The effects of the temperature and propane flow during the in situ interrupt and its duration have been investigated. The in situ process has achieved a BPD-to-TED conversion of at least 98% and a final BPD density below 10/cm$^2$.

The interrupted/modified epitaxial growth technique relies on straightforward in situ growth processes that may be easy to implement with commercial epitaxial growth systems. The processes involve adjusting gas flow rates during the growth, which may be implemented under computer control by gas flow valves.

The method begins with flowing a silicon source gas, a carbon source gas, and a carrier gas into a growth chamber under growth conditions to epitaxial grow silicon carbide on a wafer in the growth chamber. Such gases, growth chambers, wafers, and growth conditions are known in the art. Any combination of these parameters that results in growth of silicon carbide on the wafer is suitable. Some such parameters are disclosed at VanMil et al., *J. Vac. Sci. Technol. B*, 26, 1504-1507 (2008) and references therein. Any form of silicon carbide, including but not limited to 4H—SiC or 6H—SiC, may be grown.

Suitable source gases include, but are not limited to, silane and propane, which may include substituted and unsubstituted forms of the gases. Hydrogen is a suitable carrier gas. A silicon carbide wafer is a suitable wafer. The growth conditions may include a growth temperature of about 1350° C. to about 1700° C., including about 1580° C.

After at least some silicon carbide has been grown, the growth is interrupted by stopping or reducing the flow of the silicon source gas. The flow of the carrier gas is maintained. The maintained flow of the carrier gas can include some reduction in the flow, as long as at least some flow is maintained. Also, the flow of the carbon source gas may be stopped or reduced. The flow of either or both of the source gases may be completely stopped. Once the growth is interrupted, there may be etching of the previously grown silicon carbide by the carrier gas. Thus is it possible to continue to flow some amount of the source gases such that any further growth of silicon carbide during the interruption is outpaced by the etching the silicon carbide wafer. The carbon source gas may continue to flow at, for example, 0-30 sccm (standard cubic centimeters per minute).

During the in situ interruption, an elevated temperature is maintained in the growth chamber for a period of time. Suitable elevated temperatures include, but are not limited to, about 1550° C. to about 1600° C., about 1400° C., and within about 5° C. of the growth temperature. Any period of time for the interruption is possible, including but not limited to, up to or at least about 5, 10, or 15 minutes and at least about 40 minutes.

After the interruption, the flow of the silicon source gas and the carbon source gas is adjusted to reinitiate silicon carbide growth. This may be done under the original growth conditions or different growth conditions. Under certain suitable conditions, at least some of any basal plane dislocations in the epitaxially grown silicon carbide before the growth interruption are converted to threading edge dislocations in the epitaxially grown silicon carbide after the growth interruption. The conversion rate may be at least about 90%. The growth interruption and resumption may be repeated a number of times, which may improve the conversion rate.

Particular conditions that may result in BPD-to-TED conversion include, but are not limited to:

Growth temperature: 1550-1600° C.
Carbon source gas reduced to: 0 to 30 or 5-15 sccm
Elevated temperature: 1550-1600° C.
Interrupt time: ≥40 or 45 min
Growth temperature: 1580° C.
Carbon source gas reduced to: 10 sccm
Elevated temperature: 1580° C.
Interrupt time: ≥40 or 45 min The reduction of BPDs relies on the conversion of BPDs to threading edge dislocations (TEDs) at each growth interrupt and/or the use of multiple interrupts to achieve a desired overall BPD reduction. There are three steps to each interruption: stopping the growth, an interval, and restarting the growth. Ceasing the flow of silicon source gas or silane into the process tube can stop the growth, as the growth of SiC is dependent upon the presence of silicon. During the no-growth interval before restarting, the ambient conditions in the process tube can be adjusted in several ways. For example, the hydrogen flow continues and which then results in etching of the SiC sample surface. The restart process restarts the flow of silane in this example. There are a number of parameters associated with each interrupt involving the ambient, gas flows, pressure, temperature, and length of time, etc. These parameters can be optimized for maximum BPD-to-TED conversion at each interrupt without introducing new defects such as ingrown faults during the interrupt. It should be noted that some interrupts do not stop the actual epitaxial growth per se, but will interrupt or modulate a growth parameter such as growth rate or doping.

The following lists the types of interrupts that can be employed whereby the specific process parameter is manipulated in a way that results in optimal BPD conversion. It is likely that each interrupt method may be optimized for a particular substrate orientation, e.g., off-cut angle.

Temperature interrupts—The sample is grown, growth is stopped and the sample is held at a temperature for a set period. Range may be 20 to 1700° C. In-situ interrupts are considered better as these will not give rise to additional in-grown stacking faults.

C/Si ratio modulation—Abruptly change the ratio of C to Si reactants over significant range, about 0.5 to 3.0 (these ratios are highly dependent upon reactor geometry/manufacturer and are intended to represent a range of about plus/minus a factor of two from the ratio which yields the lowest n-type unintentional doping concentration).

Growth chemistry modulation—Abruptly change the constituent growth chemistry in the process tube yet epitaxy is not appreciable interrupted. This could be through the introduction of etchants, e.g., chlorine (through various forms) or by changing the carbon and silicon sources otherwise holding the C to Si ratio constant, or by changing the gas composition through the addition of Argon.

Doping of the film in which interrupts are performed—Varying the doping level and type used throughout the layer and at a constant level can impact morphology and turning efficiency.

Doping modulation—Abruptly change the doping concentration to a higher or lower level keeping the doping type (n or p) constant. Also, change the doping abruptly from n to p-type.

Growth interruption chemistry change—During an interruption, change the gas concentration, composition, or process pressure to minimize the propagation or conversion of extended defects. This also includes the addition of etchants during the interrupt.

Modulation of growth rate—Here the growth rate is the only property varied in an abrupt and significant manner; the range could be from about 0 to 10's of microns per hour (which would be dependent upon the reactor being used).

The addition of a surfactant to the growing epitaxial surface—Ge, Sn and Pb are surfactants with relatively high vapor pressures whose presence would be desirable for affecting the propagation of extended defects. This process may be best used at low growth temperatures.

Dwell time of interrupts—For those cases using interrupts, the dwell time can be varied in a desired manner.

Dwell time composition—Varied carbon overpressure and/or halogen overpressure that can be further adjusted during the interrupt.

Multiple modulations and modulation length—For those cases using interrupts or modulations, a train of modulation types can be put together, with constituent pieces having various desired lengths as appropriate. This can involve a desired number of modulations, interrupts, or combinations of such.

Inserting the appropriate interrupt method(s) into a buffer layer—The appropriate interrupt method is incorporated into an n or p-type buffer layer (for the cases in which the structure is grown on an n or p-type substrate, respectively). The thickness of the buffer layer is adjusted to accommodate the desired Interrupt Method, after which the epitaxial layer with the desired properties for device applications is grown.

Substrate preparation—Although not an interrupt per se, a desired substrate preparation is performed before epitaxial growth to minimize the presence of BPDs, stacking faults or other undesired extended defects before the growth of the desired buffer layer incorporating the desired Interrupt Method(s). This preparation includes polish, chemical cleaning, and subsequent etching either by oxidation and removal and/or the in-situ etching by hydrogen at a desired elevated temperature with or without the presence of an additional etchant such as chlorine or other halogen or in another environment such as Argon or a mixture of various gases.

The following examples are given to illustrate specific applications. These specific examples are not intended to limit the scope of the disclosure in this application.

Example 1

8° off-axis wafers—In situ growth interrupts were executed under varied conditions, including temperature (1400, 1500 and 1580° C. for 15 min), duration, (5, 15 and 45 min at 1580° C.) and propane mass flow (2 sccm and 10 sccm at 1580° C. for 15 min) during the interrupt. Each interrupt was accomplished by removing the silane gas flow and reducing the propane gas flow. The samples were typically grown to a thickness of 20 μm before the interrupt. The post interrupt epitaxial layer for all samples was nominally 20 μm thick. This allowed the length of the BPD in the epitaxial layer to be reliably measured using UVPL imaging. From the length, it was determined whether or not the BPD turned into a TED at the growth interrupt interface. The effectiveness of different interrupt schemes varied from 10 to 98% as shown in Tables 1-3. The most effective interrupt lasted for 45 minutes with a propane flow of 10 sccm at the growth temperature of 1580° C. Note the sample with the asterisk was used throughout all three experiments.

TABLE 1

Comparison of conversion efficiency from the three different temperature growth interrupts. Each interrupt was for 15 minutes and with a propane flow of 10 sccm.

| | BPDs cm$^{-2}$ Pre-Interrupt | BPDs cm$^{-2}$ Post-Interrupt | Conversion Efficiency |
|---|---|---|---|
| 1400° C. interrupt | 93 | 74 | 20% |
| 1500° C. interrupt | 191 | 139 | 28% |
| 1580° C. interrupt* | 210 | 102 | 51% |

TABLE 2

Comparison of conversion efficiency from the propane flow growth interrupts. Each interrupt was for 15 minutes at 1580° C.

| | BPDs cm$^{-2}$ Pre-Interrupt | BPDs cm$^{-2}$ Post-Interrupt | Conversion Efficiency |
|---|---|---|---|
| 2 sccm interrupt | 1894 | 1696 | 10% |
| 10 sccm interrupt* | 210 | 102 | 51% |
| 20 sccm interrupt | 2526 | 2215 | 12% |

TABLE 3

Comparison of conversion efficiency from different length growth interrupts. Each interrupt was for with a propane flow of 10 sccm at 1580° C.

| | BPDs cm$^{-2}$ Pre-Interrupt | BPDs cm$^{-2}$ Post-Interrupt | Conversion Efficiency |
|---|---|---|---|
| 5 min interrupt | 1146 | 1026 | 10% |
| 15 min interrupt* | 210 | 102 | 51% |
| 45 min interrupt | 1586 | 26 | 98% |

Example 2

Imaging—The epitaxial layers were grown in an Aixtron/Epigress VP508 hot-wall chemical vapor deposition reactor using gas foil rotation (VanMil et al., Mater. Sci. Forum, 556-557, 125 (2007)). The epitaxial layers were low doped or unintentionally doped with carrier concentrations in the low $10^{14}/cm^3$. The growth rate was normally 10 μm/hr at 1580° C. and with a C/Si ratio of 1.55. The substrates were n$^+$ wafers, $2 \times 10^{18}/cm^3$, with an 8° offcut towards <11$\bar{2}$0>. The growths with ex situ interrupts were on a single quarter wafer and all of the growths with in situ interrupts were on quarter wafers from the same boule. For the ex situ quarter wafer, three of the layers were 20 μm and one was 10 μm. All but one of the in situ layers before and after the interrupts was 20 μm.

The BPDs in the epitaxial layers were imaged using ultraviolet photoluminescence (UVPL) mapping technique (Stahlbush et al., Mater. Sci. Forum, 556-557, 295 (2007)). Over the whole area of the wafer, it non-destructively provides images of BPDs and in-grown stacking faults (IGSFs) and other dislocations throughout the thickness of the epitaxy. It uses the 364 nm and 351 nm lines of an Ar ion laser to excite electron-hole pairs; penetration depths are 120 μm and 50 μm, respectively. Individual images ~1 mm$^2$ with micron scale resolution were collected with a liquid nitrogen cooled charge-coupled device (CCD). The wavelength range was limited to 800 to 1000 nm to increase the contrast of dislocations above the background. The final full-wafer image was assembled after image processing to compensate for optical system non-uniformities.

The counting of BPDs and the conversion of BPDs to TEDs was compiled manually. The counting area in the quarter wafer with ex situ interrupts was 0.5 cm$^2$ and was chosen as a typical representation of the full area. The counting areas in the quarter wafers with in situ interrupts were larger and ranged from 4 to 5.5 cm$^2$. These counting areas did not include parts of the wafer within 5 mm of the edge or regions containing BPD clusters. Also excluded were a few small areas in which the BPDs were too close to follow the path of individual BPDs through the epitaxy.

The conversion of BPDs into TEDs due to ex situ growth interrupts is illustrated in the UVPL images in FIG. 1. It shows a 1.2×0.35 mm$^2$ area containing 5 BPDs, which is a small but typical portion of the whole image. FIG. 1(a) is taken after growing an initial 20 μm epitaxial layer. The offcut direction along <11$\bar{2}$0> is included; the offcut angle is 8°. While these BPDs are a continuation of BPDs in the substrate, they are only visible within the lightly doped epitaxial layer. Within the substrate, the dominant electron-hole recombination is due to point defects and dopant atoms, and radiative recombination at the dislocations is insufficient to form an image. One consequence is that the UVPL images do not give a count of BPDs in the substrate, and the BPD-to-TED conversion at the substrate/epi interface cannot be determined. In this work, the initial epitaxial layer provides a base count of BPDs over the quarter wafer. The counts in subsequently grown layers are compared to the initial layer.

TABLE 4

Temperature, propane flow and duration of the ex situ and in situ interrupts with BPD conversion results. Ex situ interrupts are at room temperature (RT).

| ID # | T (° C.) | $C_3H_8$ (sccm) | Time (min) | % BPDs converted | final BPD/$cm^2$ |
|---|---|---|---|---|---|
| 427 | RT | — | — | 36 | 245 |
| 725 | RT | — | — | 32 | 168 |
| 920 | RT | — | — | 34 | 110 |
| 828 | 1400 | 0 | 15 | 20 | 73 |
| 004 | 1500 | 10 | 15 | 28 | 139 |
| 914 | 1580 | 10 | 15 | 51 | 102 |
| 221 | 1580 | 0 | 15 | 7 | 231 |
| 010 | 1580 | 2 | 15 | 10 | 359 |
| 114 | 1580 | 20 | 15 | 12 | 418 |
| 009 | 1580 | 10 | 5 | 10 | 213 |
| 005 | 1580 | 10 | 45 | 98 | 5.4 |
| 424 | 1580 | 10 | 45 | 96 | 10.2 |
| 428 | 1580 | 10 | 45 | 98 | 6.9 |

Figure 2:
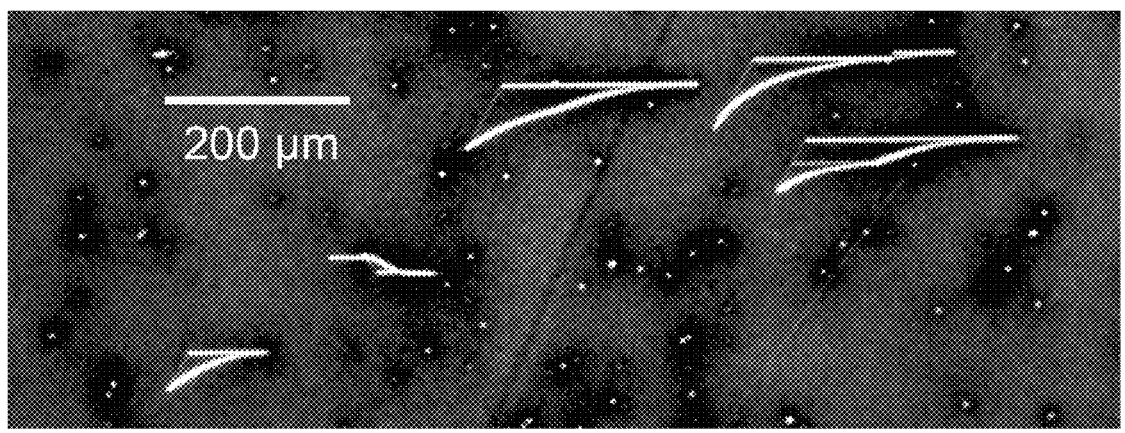
FIG. 2 shows a UVPL image of in situ sample 914 showing 2 BPDs that are converted to TEDs and 3 BPDs that continue through the whole epitaxial thickness.

The shape of the dislocations in FIGS. 1 and 2 shows that the BPDs are not perfect dislocations in the UVPL images. As grown, most of the BPDs curve within the epitaxial layer. The electron-hole recombination during imaging of each curved BPD is sufficient to cause an initial rapid faulting along the segment of the BPD within the epitaxial layer. One boundary of the faults is a curved partial dislocation along the initial BPD path. The other two boundaries are Si-core and C-core partials along the <11$\bar{2}$0> directions (Liu et al., *Appl. Phys. Lett.*, 90, 153503 (2007)). The Si-core partials are the bright horizontal lines and the C-core partials are the faint straight lines along the left of each fault that join the ends of the curved and Si-core partials. The initial faulting is rapid compared to the UV exposure time. Furthermore, once the moving partials lie along the energetically favorable <11$\bar{2}$0> directions, their subsequent movement with UV exposure is much slower. Thus the initially moving partials are captured as straight lines along <11$\bar{2}$0> directions in the UVPL images.

The left-to-right length of the BPDs in FIG. 1(*a*) indicates that they traverse the entire thickness of the initial 20 μm epitaxy. As shown in the schematic cross-section, FIG. 1(*d*), the left end of each BPD is at the substrate/epi interface. The length of each of the BPDs in FIG. 1(*a*) is 135 μm. The epitaxy thickness calculated from this length is (135 μm)tan(8°)=19 μm where 8° is the offcut angle; this is within experimental error. FIG. 1(*b*) shows the same area after the second 20 μm epitaxial growth, sample 427 in Table 4. BPDs that continue and ones that are converted into TEDs (or turn) are labeled C and T, respectively. The two continuing BPDs are 265 μm long, which is twice as long as the BPDs after the first growth showing that they continue to the top of the second epitaxial layer. The BPDs labeled T are converted into TEDs at the start of the second growth. Over the sampled area, the density of individual BPDs in the initial epitaxial layer was ~700/$cm^2$ and their conversion to TEDs was 36%. Table 4 also shows the results of two subsequent ex situ growths that had conversions of 32% and 34% with a cumulative conversion of 71%. The results suggest that conversion is a random process for ex situ growth interrupts and that the average conversion at each interface is independent of the previous conversions.

During the three epitaxial growths following the initial growth, no new BPDs were introduced at any of the interrupt interfaces. In-grown stacking faults (IGSFs) are also present in the epitaxial layers but have different characteristics. Unlike the Shockley stacking faults that originate from BPDs in the substrate and expand during device operation, IGSFs are formed during epitaxial growth and are not changed by device operation. Another difference is that at the start of each epitaxial layer new IGSFs were introduced and none of the IGSFs terminated at the start of a new epitaxial layer.

The images in FIG. 1 also show the glide of BPDs in the basal plane and indicate that TED glide in a prismatic plane during epitaxial growth. FIG. 1(*c*) is an overlay of FIGS. 1(*a*) and 1(*b*). The BPD glide in the basal plane is evident for BPDs, C1 and C2. For both BPDs their position at the substrate/epi interface does not move, but their path in the first layer glides upward during the growth of the second layer (Zhang et al., *J. Appl. Phys.*, 102, 093520 (2007); Stahlbush et al., *Mater. Sci. Forum*, 600-603, 317-320 (2008)). This glide in the basal plane is attributed to shear stress in the epitaxy. The evidence for glide of TEDs in a prismatic {11$\bar{2}$0} plane comes from comparing the lengths of the three BPDs, T1-T3, that are converted (or turned) into TEDs. After the second growth, T2 and T3 are shorter by 30 μm and T1 by 25 μm. They maintain the same position at the substrate/epi interface. Initially, the turning point is at the start of the second growth, but as the second layer is grown the turning point moves to the left as the TED glides. The length of the BPD is reduced and the TED length is increased but by a much smaller amount. The combined BPD-TED length is shorter, which is likely the driving force.

The next growth interrupts investigated were in situ. The UVPL images taken of the ex situ growth interrupts demonstrate that these images are capable of observing the BPD-to-TED conversion for in situ growth interruptions. For example, the ex situ image, FIG. 1(*b*) taken after the second epitaxial growth is sufficient to determine which BPDs are converted without seeing the image after the first growth, FIG. 1(*a*). The advantage of in situ interruptions is they are performed without removing the wafer from the epitaxial growth chamber, which significantly decreases the time and complexity of performing the growth interruptions. Another advantage of the in situ interrupts is that negligible new IGSFs are introduced, in contrast to the ex situ interrupts, which each introduce similar numbers of new IGSFs.

All of the in situ growth interrupts were accomplished by stopping the silane flow. Three other growth parameters were varied during the interrupt to investigate their effect on BPD-to-TED conversion: temperature, propane flow and interrupt time. A summary of the variations, the conversion percentages and the final BPD densities is given in Table 4. The density of individual BPDs before the interrupt ranged from 100 to 500/$cm^2$. It shows conversion ranging from 7% to 98%. The best conversions have single-digit BPD/$cm^2$ after a single interrupt.

Three interrupt temperatures were tried: 1400° C., 1500° C., and 1580° C., the growth temperature (VanMil et al., *J. Vac. Sci. Technol. B*, 26, 1504-1507 (2008)). The lowest temperature was chosen because at 1400° C. hydrogen etching is minimal. In each case, the time at the interrupt temperature was 15 min and the propane flow rate was reduced from the 20.6 sccm rate used during growth to 0 or 10 sccm. The conversion percentages were 20%, 28% and 51%, respectively; see Table 4. Based on these results, all subsequent in situ interrupts were done at the growth temperature, 1580° C. An additional advantage of interrupts at 1580° C. is that the temperature ramps between the growth step and interrupt step are eliminated. In FIG. 2, a 1.2 mm×0.45 mm area of the UVPL image of sample 914, 1580° C. interrupt, illustrates the clear difference between BPDs that are converted and those that continue through the interrupt. The bright dots are due to luminescence from threading dislocations. With the temperature held at 1580° C. and the interrupt time set to 15 min, interrupts with higher and lower propane flows were investigate but yielded lower conversion percentages; see Table 4.

The time variations produced notable results. With the temperature and propane flow set to 1580° C. and 10 sccm, additional samples with single interrupts lasting 5 and 45 min were grown. The conversion percentages for samples 009, 914 and 005 (5, 15 and 45 min) were 10%, 51%, and 98%, respectively. The final BPD density of the 98% sample was 5.4/cm$^2$, which is in the range where their effect on power devices is minimal (Sumakeris et al., *Mater. Res. Soc. Bull.*, 30, 280 (2005)). The results were confirmed with samples 424 and 428, which had conversions of 96% and 98% and final BPD densities of 10.2 and 6.9/cm$^2$.

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. A method comprising:
    flowing a silicon source gas, a carbon source gas, and a carrier gas into a growth chamber under growth conditions to epitaxially grow silicon carbide on a wafer in the growth chamber;
    stopping or reducing the flow of the silicon source gas to interrupt the silicon carbide growth and maintaining the flow of the carrier gas while maintaining an elevated temperature of about 1550° C. to about 1600° C. in the growth chamber for a period of time; and
    resuming the flow of the silicon source gas to reinitiate silicon carbide growth;
        wherein the wafer remains in the growth chamber throughout the method;
        wherein at least about 90% of any basal plane dislocations in the epitaxially grown silicon carbide before the growth interruption are converted to threading edge dislocations in the epitaxially grown silicon carbide after the growth interruption.

2. The method of claim 1;
    wherein the silicon source gas is silane;
    wherein the carbon source gas is propane; and
    the carrier gas is hydrogen.

3. The method of claim 1, wherein the wafer is a silicon carbide wafer.

4. The method of claim 1, wherein the epitaxially grown silicon carbide is 4H—SiC or 6H—SiC.

5. The method of claim 1, wherein the growth conditions include a growth temperature of about 1350° C. to about 1700° C.

6. The method of claim 1, wherein the growth conditions include a growth temperature of about 1580° C.

7. The method of claim 1, wherein stopping or reducing the flow of the silicon source gas comprising completely stopping the flow of the silicon source gas.

8. The method of claim 1, further comprising:
    stopping or reducing the flow of the carbon source gas while stopping or reducing the flow of the silicon source gas; and
    resuming the flow of the carbon source gas while resuming the flow of the silicon source gas.

9. The method of claim 8, wherein stopping or reducing the flow of the carbon source gas comprises reducing the flow of the carbon source gas to about 0-30 sccm.

10. The method of claim 8;
    wherein the growth conditions include a temperature of about 1550° C. to about 1600° C.;
    wherein reducing the flow of the carbon source gas comprises reducing the flow of the carbon source gas to about 5-15 sccm; and
    wherein the period of time is at least about 45 minutes.

11. The method of claim 8;
    wherein the growth conditions include a temperature of about 1580° C.;
    wherein reducing the flow of the carbon source gas comprises reducing the flow of the carbon source gas to about 10 sccm;
    wherein the elevated temperature is about 1580° C.; and.
    wherein the period of time is at least about 45 minutes.

12. The method of claim 1, wherein the elevated temperature is within about 5° C. of the temperature of the growth conditions.

13. The method of claim 1, wherein the period of time is at least about 15 minutes.

14. The method of claim 1, wherein the period of time is at least about 45 minutes.

15. The method of claim 1, wherein the concentration of basal plane dislocations in the epitaxially grown silicon carbide after the growth interruption is less than 10/cm$^2$.

16. A method comprising:
    flowing a silicon source gas, a carbon source gas, and a carrier gas into a growth chamber under growth conditions to epitaxially grow silicon carbide on a wafer in the growth chamber;
    stopping or reducing the flow of the silicon source gas to interrupt the silicon carbide growth and maintaining the flow of the carrier gas while maintaining an elevated temperature in the growth chamber for a period of time of at least about 45 minutes; and
    resuming the flow of the silicon source gas to reinitiate silicon carbide growth;
        wherein the wafer remains in the growth chamber throughout the method;
        wherein at least about 90% of any basal plane dislocations in the epitaxially grown silicon carbide before the growth interruption are converted to threading edge dislocations in the epitaxially grown silicon carbide after the growth interruption.

17. The method of claim 16, wherein the concentration of basal plane dislocations in the epitaxially grown silicon carbide after the growth interruption is less than 10/cm$^2$.

* * * * *